(12) United States Patent
Kalinin et al.

(10) Patent No.: US 7,089,794 B2
(45) Date of Patent: Aug. 15, 2006

(54) METHOD AND APPARATUS FOR TRACKING A RESONANT FREQUENCY

(75) Inventors: Victor Alexandrovich Kalinin, Oxford (GB); John Peter Beckley, Bicester (GB)

(73) Assignee: Transense Technologies PLC, (GB)

( * ) Notice: Subject to any disclaimer, the term of this patent is extended or adjusted under 35 U.S.C. 154(b) by 0 days.

(21) Appl. No.: 10/512,129

(22) PCT Filed: Apr. 15, 2003

(86) PCT No.: PCT/GB03/01627

§ 371 (c)(1),
(2), (4) Date: Oct. 13, 2004

(87) PCT Pub. No.: WO03/090353

PCT Pub. Date: Oct. 30, 2003

(65) Prior Publication Data

US 2005/0172718 A1   Aug. 11, 2005

(30) Foreign Application Priority Data

Apr. 18, 2002 (GB) .................. 0208881.3

(51) Int. Cl.
*G01N 29/00* (2006.01)
(52) U.S. Cl. .............. 73/579; 73/597; 73/602
(58) Field of Classification Search .......... 73/579, 73/580, 583, 589, 590, 597, 599, 620, 630–631, 73/643, 654, 657, 602; 324/602, 633, 71.1
See application file for complete search history.

(56) References Cited

U.S. PATENT DOCUMENTS 5,585,571 A   12/1996 Lonsdale et al.
5,585,574 A * 12/1996 Sugihara et al. ....... 73/862.334
5,909,456 A *  6/1999 Oka .......................... 372/22
6,433,541 B1 * 8/2002 Lehman et al. ............ 324/230
6,467,351 B1 * 10/2002 Lonsdale et al. ............ 73/579
6,581,478 B1 * 6/2003 Pahl et al. ............. 73/862.326

(Continued)

FOREIGN PATENT DOCUMENTS

GB        2355801        5/2001

(Continued)

OTHER PUBLICATIONS

U. Wolff et al., "SAW Sensors for Harsh Environments", IEEE Sensors Journal, vol. 1, No. 1, Jun. 2001, pp. 4-13.

*Primary Examiner*—Hezron Williams
*Assistant Examiner*—Jacques Saint-Surin
(74) *Attorney, Agent, or Firm*—Keusey, Tutunjian & Bitetto, P.C.

(57) ABSTRACT

An arrangement for tracking resonant frequency of electrically resonant structures through a single channel includes a variable frequency oscillator associated with each resonant structure which provides an excitation signal of a variable frequency encompassing a possible resonant frequency of the associated resonant structure. Coupling device(s) are provided which connect each variable frequency oscillator to said resonant structure(s). An I-mixer is provided for each oscillator which forms a synchronous detector, a first input of each I-mixer being connected to its associated oscillator and a second input being connected to the coupling device, each I-mixer mixing the excitation signal from the associated variable frequency oscillator with a response signal generated by the resonant structure(s) in response to each excitation signal. The output of each I-mixer is filtered to remove sum products of the excitation and response signals, thereby leaving an amplitude modulation component of the signal, which is processed in a control loop to track the resonant frequency of each resonant structure.

18 Claims, 2 Drawing Sheets

U.S. PATENT DOCUMENTS

| | | | |
|---|---|---|---|
| 6,621,264 B1 * | 9/2003 | Lehman et al. | 324/230 |
| 6,628,177 B1 * | 9/2003 | Clark et al. | 333/186 |
| 6,630,871 B1 * | 10/2003 | Ma et al. | 331/116 M |
| 6,903,489 B1 * | 6/2005 | Suzuki et al. | 310/320 |

FOREIGN PATENT DOCUMENTS

| | | |
|---|---|---|
| WO | WO 98/21818 | 5/1998 |
| WO | WO 01/46684 | 6/2001 |

* cited by examiner

METHOD AND APPARATUS FOR TRACKING A RESONANT FREQUENCY

FIELD OF THE INVENTION

The present invention relates to improved methods for tracking resonant frequencies of electrically resonant structures, in particular structures, which are mounted remotely from the driving and sensing electronics.

BACKGROUND OF THE INVENTION

International patent application no. WO 98/21818 discloses a system for tracking the resonant frequency of an electrically resonant structure in which a variable frequency oscillator, which generates an excitation signal of a variable frequency encompassing the possible resonant frequency range of the target resonant structure, is connected to the resonant structure by a bi-directional RF transmission line. The proportion of the excitation signal energy reflected and the proportion dissipated by the resonant structure will depend upon the difference between the frequency of the excitation signal and the resonant frequency of the resonant structure, and the transmission line incorporates a directional coupler, which generates a directional coupler signal proportional to the reflected signal from the resonant structure. The directional coupler signal is conditioned by a processor to provide a feedback signal to the input of the variable frequency oscillator such that the mean frequency of the excitation signal is caused continuously to track the varying resonant frequency of the resonant structure.

This arrangement has particular application in the non-contact torque measurement using SAW (surface acoustic wave) devices as the sensing elements. Many such applications, however, use two SAW devices attached to a rotating shaft in such a way that when torque is applied one resonator is put in tension whilst the second is put in compression. This causes the resonant frequency of the first device to reduce whilst the second will increase. The two devices would normally have a nominal difference between them of 1 MHz, such that with torque the output from the system is a difference frequency that changes about 1 MHz with applied torque. However, in order to be used in conjunction with the tracking system of the prior art, the two sensors on the shaft must be electrically connected to the stator of the assembly via two pairs of non-contacting rotary coupled transmission lines. The use of two pairs of couplers has the disadvantage that the size and complexity of the mechanical assembly is increased, and thereby the cost. In addition, the rotary coupled transmission line can load the SAW resonator and thereby modify its frequency. As the system is a differential one, if both couples modify their respective sensor response by the same amount, then this effect can be cancelled out, but if the two channels are not identical then an error in the reading obtained can result.

The arrangement of the prior art has the further disadvantage that the requirement for a directional coupler increases the complexity of the arrangement.

SUMMARY

According to one aspect of the present invention there is provided a method of tracking the resonant frequency of an electrically resonant structure comprising the steps of exciting the resonant structure with a reference signal of a variable frequency encompassing the possible resonant frequency of the resonant structure, mixing a response signal from the resonant structure with the reference signal, filtering the mixed response and reference signals to remove the sum products from the composite signal, and using the resulting amplitude modulation component of the response signal within a control loop to track the resonant frequency of the resonant structure.

The present invention further provides an apparatus for tracking the resonant frequency of an electrically resonant structure, comprising a variable frequency oscillator providing an excitation signal of a variable frequency encompassing the possible resonant frequency of said resonant structure, coupling means connecting said variable frequency oscillator to said resonant structure, an I-mixer forming a synchronous detector having a first input connected to said oscillator and a second input connected to the coupling device, the I-mixer mixing the excitation signal from the variable frequency oscillator with a response signal generated by the resonant structure in response to the excitation signal, a filter connected to the output of the I-mixer which filters the output of the I-mixer to remove the sum products of excitation and response signals, thereby leaving just an amplitude modulation component of the signal, and processing means which processes the filtered signal to track the resonant frequency of the resonant structure.

An apparatus for and method of tracking a resonant frequency in accordance with the invention has the advantage that it enables multiple resonant structures to be connected together and interrogated through a single channel, whilst, at the same time, obviating the need for a directional coupler to be used.

Preferably, the reference signal from the oscillator is mixed, through the coupling means, with a second reference signal from a second oscillator of a variable frequency encompassing the possible resonant frequency of a second resonant structure, the first and second resonant structures having a nominal difference frequency, and said first and second resonant structures are excited with said mixed signal. The composite response signal of said first and second resonant structures is then mixed with the first reference signal, the mixed signal filtered using a filter, preferably a low pass filter, and the resulting signal used within a control loop to track the resonant frequency of the first resonant structure, and it is also mixed with the second reference signal, by a separate mixer, the mixed signal filtered and the resulting signal used within a control loop to track the resonant frequency of the second resonant structure. In this way, it is possible to track the resonant frequency of a pair of structures connected in parallel through a single channel. The coupling of the two signals to the resonant structures is preferably achieved by use of a summer connected to the input of the coupling means.

An impedance such as a resistor is preferably provided between the oscillator and the resonant structure, in particular between the oscillator and the coupling means. Furthermore, the or each signal source preferably has a low output impedance, which has the advantage of suppressing any amplitude modulation of the or each reference signal.

In a particularly preferred embodiment of the invention, a Q-mixer is provided for the or each signal source, to one input of which is connected the signal source through a phase shifter which shifts the reference signal received at the first input by preferably 90 degrees, and to the other input of which is connected the coupling means so as to deliver the response signal thereto. The output of the or each Q-mixer is similarly filtered to remove the sum products of the input signals, thereby leaving just the amplitude modulation component of the response signal. The square of that signal is then summed with the square of the filtered signal output of the associated I-mixer and then processed to track the resonant frequency of the associated resonant structure. In this way, errors in the tracked frequency resulting from the phase delay of the signal at the input of the coupling device are eliminated.

The squaring and summing operations may be carried out digitally by use of A/D converters and suitable digital processing means, which may also calculate first harmonic amplitudes of the demodulated signals produce codes for controlling the carrier frequency of the signal sources. Alternatively, analog signal squaring means may be utilized, such as a mixer with its inputs linked.

It will, of course, be understood that the system may be expanded to track the resonant frequencies of more than two structures, such as SAW devices. For such multiple resonant structures, there is preferably a nominal frequency difference between each device of at least 1 MHz.

BRIEF DESCRIPTION OF THE DRAWINGS

In order that the invention may be well understood, there will now be described some embodiments thereof; given by way of example, reference being made to the accompanying drawings, in which.

DETAILED DESCRIPTION OF PREFERRED EMBODIMENTS

Figure 1:
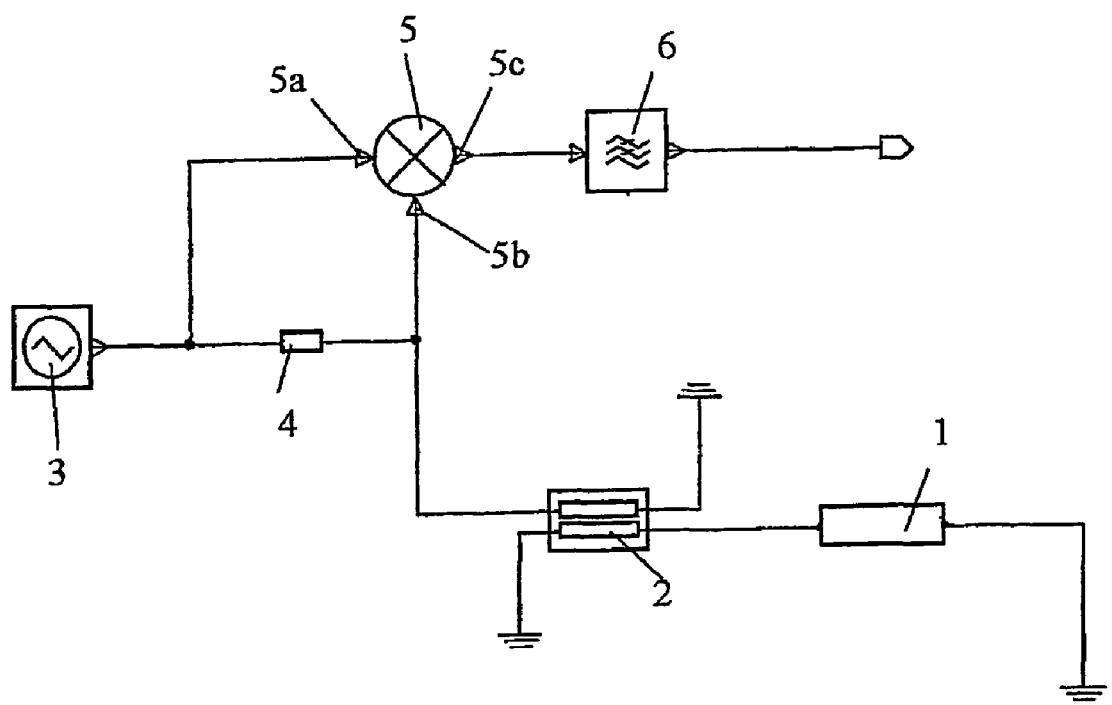
FIG. 1 is a simplified schematic representation of a system embodying the invention suitable for tracking the resonant frequency of a single structure.

Referring first to FIG. 1, there is shown a simplified schematic of a system embodying the invention. The output of a signal source 3 is connected directly to one input 5a of a mixer 5 and through a resistor 4 to the input of a coupling device 2, which, in turn, is connected to a single SAW resonator 1. The input of the coupling device 2 is also connected to a second input 5b of the mixer 5. The coupling device preferably takes the form of a rotational contactless coupler, but other coupling devices are also possible, and the signal source 3 takes the form of a high frequency oscillator with a center frequency within the bandwidth of the resonator 1 and it is frequency modulated again within a deviation that is within the bandwidth of the resonator. Upon operation of the system, the SAW resonator 1 is excited by the reference signal from the signal source 3. The impedance of the SAW resonator 1 will change rapidly with frequency around its resonant point and will form a potential divider with the resistor 4, so that when the impedance of the resonator 1 is high compared with that of the resistor 4, there will be minimal voltage drop across the resistor 4, whereas when the impedance of the resonator 1 is low compared with that of the resistor 4, there will be a large voltage drop across the resistor 4 and minimal across the resonator 1. In this way, the amplitude of the response of the SAW 1 to the reference signal, as seen at the second input 5b of the mixer 5 from the coupling device 2, will also vary as the frequency of the signal source 3 is modulated. By using a signal source 3 of low output impedance, the amplitude modulation of the output of the signal source 3 fed to the first input 5a of the mixer will be suppressed. As a result, the mixer 5, acting as a synchronous detector, will output through its output line 5c a signal which will be the sum of the driving signal from the signal source 3 and the amplitude modulated signal response of the resonator 1. A low pass filter 6 is then used to remove the sum products of the signals, leaving just the amplitude modulation component of the signal which can then be used within a control loop to track the resonant frequency of the SAW device 1 in the manner described in WO98/21818.

In a development of this embodiment not illustrated, a buffer is inserted in front of the resistor 4 that further reduces the parasitic amplitude modulation in the reference signal.

Figure 2:
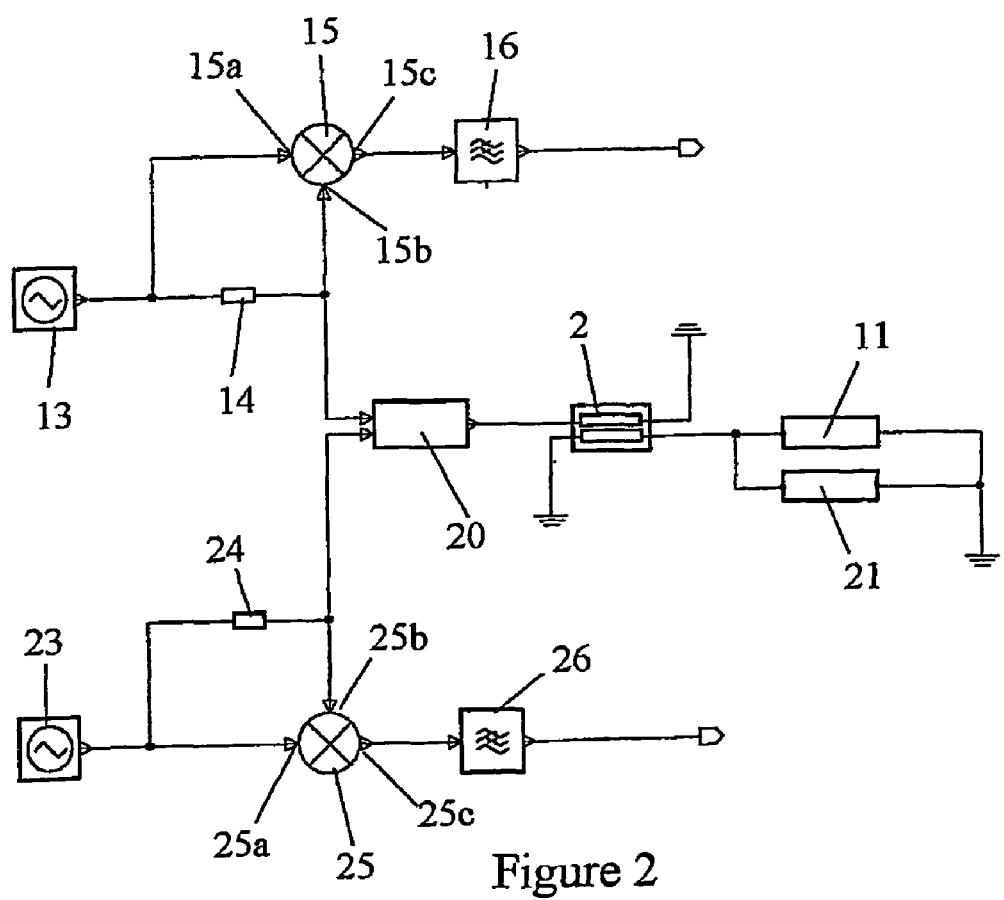
FIG. 2 is a schematic representation of a system embodying the invention suitable for tracking the resonant frequency of two resonant structures.

FIG. 2 shows a schematic representation of how the system of FIG. 1 can be used to connect together and interrogate two SAW resonators which have a nominal difference frequency of, say, 1 Mhz through a single channel which requires just a single coupling device. The two SAW devices 11, 21 are arranged in parallel and connected to the coupling device 2 which is, in turn, connected to the output of a summer 20. One input of the summer 20 is connected to one input 15b of a first mixer 15 and through a first resistor 14 to a first signal source 13, which generates a first reference signal, the first signal source also being coupled directly to the other input 15a of the first mixer 15. The other input of the summer 20 is connected to one input 25b of a second mixer 25 and through a second resistor 24 to a second signal source 23, which generates a second reference signal, the second signal source also being coupled directly to the other input 25a of the second mixer 25. Each of the signal sources 13, 23 takes the form of a high frequency oscillator with a center frequency within the bandwidth of its associated resonator 11, 21 and it is frequency modulated again within a deviation that is within the bandwidth of its associated resonator 11, 21. The coupling device 2 again preferably takes the form of a rotational contactless coupler, but other coupling devices are also possible.

Each half of the system then operates in the same manner as described above in relation to FIG. 1, with the reference signal from the first signal source 13 exciting the first SAW 11 and the reference signal from the second signal source 23 exciting the second SAW 21. The amplitude modulated response signals from the two SAWs 11, 21 will then be fed back through the coupling device 2 and the combined signals fed to the inputs 15b, 25b of both the first and the second mixer 15, 25 by the summer 20. At the first mixer 15, the combined response signal is mixed with the reference signal from the first signal source 13 and the sum products are then removed by the first low pass filter 16 connected to the output 15c of the first mixer 15. Furthermore, because of the nominal difference frequency between the two SAWs and because the amplitude modulation caused by each SAW device 11, 21 will be at the same fundamental and harmonic frequencies, the output of the first low pass filter 16 can easily be processed electronically in a manner well known to the skilled person to separate out the amplitude modulated component of the response from the first SAW 11. This can then be used within a control loop to the first signal source 13 to track the resonant frequency of the first SAW 11.

Similarly, at the second mixer 25, the combined response signal is mixed with the reference signal from the second signal source 23 and the sum products are then removed by a second low pass filter 26 connected to the output 25c of the second mixer 25. The output of the second low pass filter 26 can then be processed electronically to separate out the amplitude modulated component of the response from the second SAW 21 due in the nominal frequency difference between the first and second SAWS 11, 21. This can then be used within a control loop to the second signal source 23 to track the resonant frequency of the second SAW 21.

For example, if the SAW devices 11, 21 have nominal frequencies of 200 MHz and 201 MHz, giving a nominal difference frequency of 1 MHz and the amplitude modulation caused by each SAW device is at 5 kHz with the $2^{nd}$ harmonics at 10 kHz, these will be excited by the reference signals produced by the two signal sources 13, 23 having frequencies of 200 MHz FM and 201 MHz FM respectively. When the 200 Mhz FM signal is mixed with the composite 200 and 201 MHz FM response signal with amplitude modulation from the SAWs 11, 21, the difference product will be the 5 kHz signal generated by the modulation due to the excitation of the 200 MHz SAW, the modulation caused by the 201 MHz device being offset by 1 MHz and therefore easily filtered out. Similarly, when the 201 MHz FM signal is mixed with the composite response signal, the modulation caused by the 200 MHz SAW can also easily be filtered out.

Figure 3:
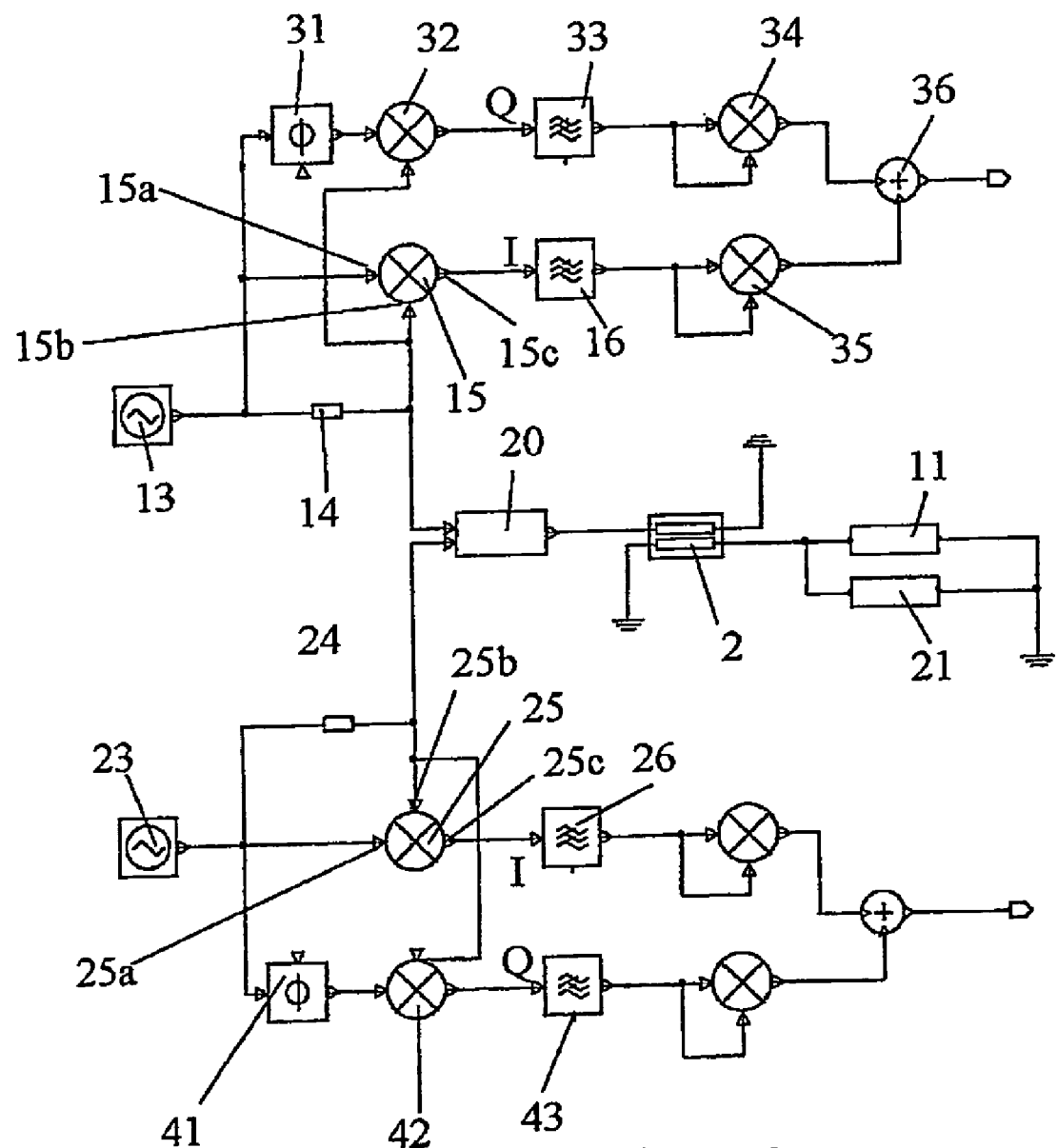
FIG. 3 is a schematic representation of a system according to an alternative embodiment containing two resonant structures with I and Q synchronous detectors.

A drawback with the embodiments described above in relation to FIGS. 1 and 2 is that the actual frequencies that will be tracked using the demodulated signal produced by the synchronous detector will slightly differ from the resonant frequency of the SAW device and the amount of this difference will depend on the phase delay of the signal at the input of the coupling device. In some cases it may be difficult to ensure a high stability of the phase delay, which will result in random errors in the measurement of the resonant frequency. FIG. 3 shows a third embodiment of the invention in which phase delay effects are eliminated by mixing the reference and response signals for each signal source in an IQ mixer and producing the demodulated signal as a sum of the squares of the signals at I (in-phase) and Q (Quadrature) outputs of the IQ mixers 30, 40. This is achieved by supplementing the system of FIG. 2 with an additional pair of Q-mixers 32, 42, one associated with each signal source 13, 23.

One input of the first Q-mixer 32 associated with the first signal source 13 is connected to the first signal source 13 through a 90 degree phase shifter 31 so as to receive a phase shifted version of the reference signal from the first signal source 13. The other input of the first Q-mixer 32 is connected to the summer 20 so as to receive the response signals from the two SAW devices 11, 21. The output of the first Q-mixer 32 is then filtered using a low pass filter 33 before being squared and then summed with the filtered and squared output of the first mixer 15, which is based in the in-phase reference signal. The sum of the squares of these two signals will not, then, depend on the phase delay of the input signal.

The squaring and summing of the signals may be achieved by analog means using looped mixers 34, 35 and a summer as shown in FIG. 3. Alternatively, the output of the low pass filters 16, 33 can be converted into digital signals using A/D converters and the squaring and adding of the signals performed by a digital processor. Apart from performing the squaring and adding functions, the digital processor will also calculate the first harmonic amplitudes of the demodulated signals and produce the codes that will control the carrier frequencies of the digital synthesizers used as the signal sources.

It will, of course, be understood that a second Q-mixer 42, phase shifter 41 and low pass filter 43 will be associated with the second signal source 23.

The invention claimed is:

1. A method of tracking resonant frequencies of first and second electrically resonant structures having a nominal difference frequency comprising the steps of:

generating a first reference signal having a variable frequency encompassing the possible resonant frequency of the first resonant structure;

generating a second reference signal having a variable frequency encompassing the possible resonant frequency of the second resonant structure;

summing the first and second reference signals;

exciting said first and second resonant structures with said summed signal;

mixing a composite response signal received from said first and second resonant structures with the first reference signal;

filtering the mixed composite response and first reference signals and using the resulting filtered signal within a controlled loop to track the resonant frequency of the first structure;

mixing the composite response signal of said first and second resonant structures with said second reference signal; and filtering the mixed composite response and second reference signals and using the resulting filtered signal within a controlled loop to track the resonant frequency of the second resonant structure.

2. A method according to claim 1, wherein the or each mixed response and reference signals are filtered using a low pass filter.

3. A method according to claim 1, comprising the further step of suppressing the amplitude modulation of the or each reference signal by using a signal source of low output impedance.

4. A method according to claim 1, wherein the or each reference signal passes through an impedance before exciting the or each resonant structure.

5. A method according to claim 1, comprising the further step, for the or each reference signal, of mixing the response signal with a phase shifted version of the or each reference signal, filtering said mixed signal, squaring the filtered in-phase and phase shifted mixed response and reference signals, summing the associated squared signals and using the result within a control loop to provide a phase compensated track of the resonant frequency of the associated resonant structure.

6. A method according to claim 5, wherein the reference signal is phase shifted through 90 degrees.

7. An apparatus for tracking a resonant frequencies of first and second electrically resonant structures having a nominal difference frequency, comprising:

a first variable frequency oscillator providing a first excitation signal of a variable frequency encompassing the possible resonant frequency of said first resonant structure;

a second variable frequency oscillator providing a second excitation signal of a variable frequency encompassing the possible resonant frequency of the second resonant structure;

a coupling means device connecting said first and second variable frequency oscillators to said first and second resonant structures;

a first I-mixer forming a first synchronous detector having a first input connected to said first variable frequency oscillator and a second input connected to the coupling device, the first I-mixer mixing the excitation signal from the first variable frequency oscillator with a composite response signal received from the first and second resonant structures;

a first filter connected to the output of the first I-mixer which filters the output of the first I-mixer to remove the sum products of excitation and response signals;

processing means which processes the filtered signal to track the resonant frequency of the first resonant structure, and further comprising:

a second I-mixer forming a second synchronous detector associated with the second oscillator having a first input connected to the second oscillator and a second input connected to the coupling device so as to mix the second excitation signal from the second oscillator with the composite response signal received from said first and second resonant structures;

a second filter connected to the output of the second I-mixer which filters the output signal of the second I-mixer; and second processing means which processes the filtered signal from the second I-mixer to track the resonant frequency of the second resonant structure.

8. An apparatus according to claim 7, wherein said first and second resonant structure are connected in parallel.

9. An apparatus according to claim 7, further including a summer having first and second inputs connected to the first and second oscillators respectively, and an output connected to the coupling means.

10. An apparatus according to claim 7, wherein the or each filter is a low pass filter.

11. An apparatus according to claim 7, further comprising an impedance connected between the or each oscillator and the coupling device, the first input of the or each I-mixer being connected between its associated oscillator and its impedance and the second input of the or each I-mixer being connected between the associated impedance and the coupling device.

12. An apparatus according to claim 7, further including a Q-mixer associated with the or each oscillator having a first input connected to its associated oscillator by means of phase shifting means and a second input connected to the coupling means such that the or each Q-mixer mixes a phase shifted version of the excitation signal from its associated oscillator with the response signal, a filter connected to the output of the or each Q-mixer which removes the sum products of the phase shifted excitation and response signals, and further including means associated with the or each oscillator for squaring and then summing the filtered signals from the I- and Q-mixers associated with the or each oscillator, said processing means processing the sum of the squares of the filtered signals from said I- and Q mixers, whereby phase delay effects are eliminated.

13. An apparatus according to claim 12, wherein the or each phase shifting means phase shifts the signal by 90 degrees.

14. An apparatus according to claim 12, wherein said means for squaring and summing said signals comprises first analog signal squaring means connected to the filtered output of the or each I-mixer, a second analog squaring means connected to the filtered output of the or each Q-mixer, and a summer associated with the or each pair of I and Q mixer having a first and second inputs connected to the outputs of the associated first and second squaring means.

15. An apparatus according to claim 14, wherein the said analog signal squaring means each comprise a mixer having first and second inputs connected together to the output of its associated filter.

16. An apparatus according to claim 12, wherein said means for squaring and summing the signals comprises a digital processor, the output of each filter being connected to an analog to digital converter which is, in turn, connected to an input of the digital processor.

17. An apparatus according to claim 16, wherein the or each digital processor also calculates first harmonic amplitudes of the demodulated signals and produces codes for controlling the carrier frequency of the signal source.

18. An apparatus according to claim 7, wherein the coupling means is a rotational contactless coupler.

* * * * *